United States Patent [19]

Reich et al.

[11] 4,188,654
[45] Feb. 12, 1980

[54] INCANDESCENT LAMPS/FIBER OPTIC COUPLED VERTICAL AND SCALE OR DISPLAY

[75] Inventors: Zygmund Reich, Burlington; Raymond W. Sargent, Vergennes, both of Vt.

[73] Assignee: Simmonds Precision Products, Inc., Tarrytown, N.Y.

[21] Appl. No.: 817,460

[22] Filed: Jul. 19, 1977

[51] Int. Cl.² .............................................. G01K 1/06
[52] U.S. Cl. .................................. 362/32; 362/212; 362/294
[58] Field of Search ................... 362/23, 24, 25, 26, 362/27, 28, 29, 30, 32; 350/96.1

[56] References Cited

U.S. PATENT DOCUMENTS

| | | | |
|---|---|---|---|
| 3,328,589 | 6/1967 | Ferguson, Jr. | 350/96.1 |
| 3,532,873 | 10/1970 | Batson et al. | 362/32 |
| 3,712,724 | 1/1973 | Courtney-Pratt | 362/32 |
| 3,809,877 | 5/1974 | Kwong | 362/32 |

Primary Examiner—Samuel W. Engle
Assistant Examiner—Edward F. Miles
Attorney, Agent, or Firm—Edwin E. Greigg

[57] ABSTRACT

A bar and circular display or scale indicator utilizing a matrix of miniature incandescent lamps which individually illuminate closely stacked light transmitting segments forming closely spaced dot positions spaced along the length of the bar. The incandescent lamps are staggered throughout the length of the display with the light transmitting segments (fiber optics) directing light from the lamp source toward the center of the display, to present emitted light in a well defined line to which provide a linear or circular solid state display. The dot positions can be illuminated in any number of ways individually, sequentially or otherwise, depending on the selected mode of operation.

5 Claims, 5 Drawing Figures

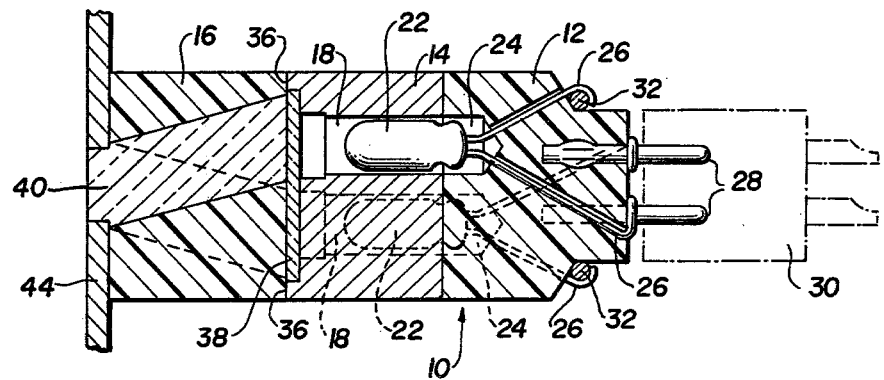
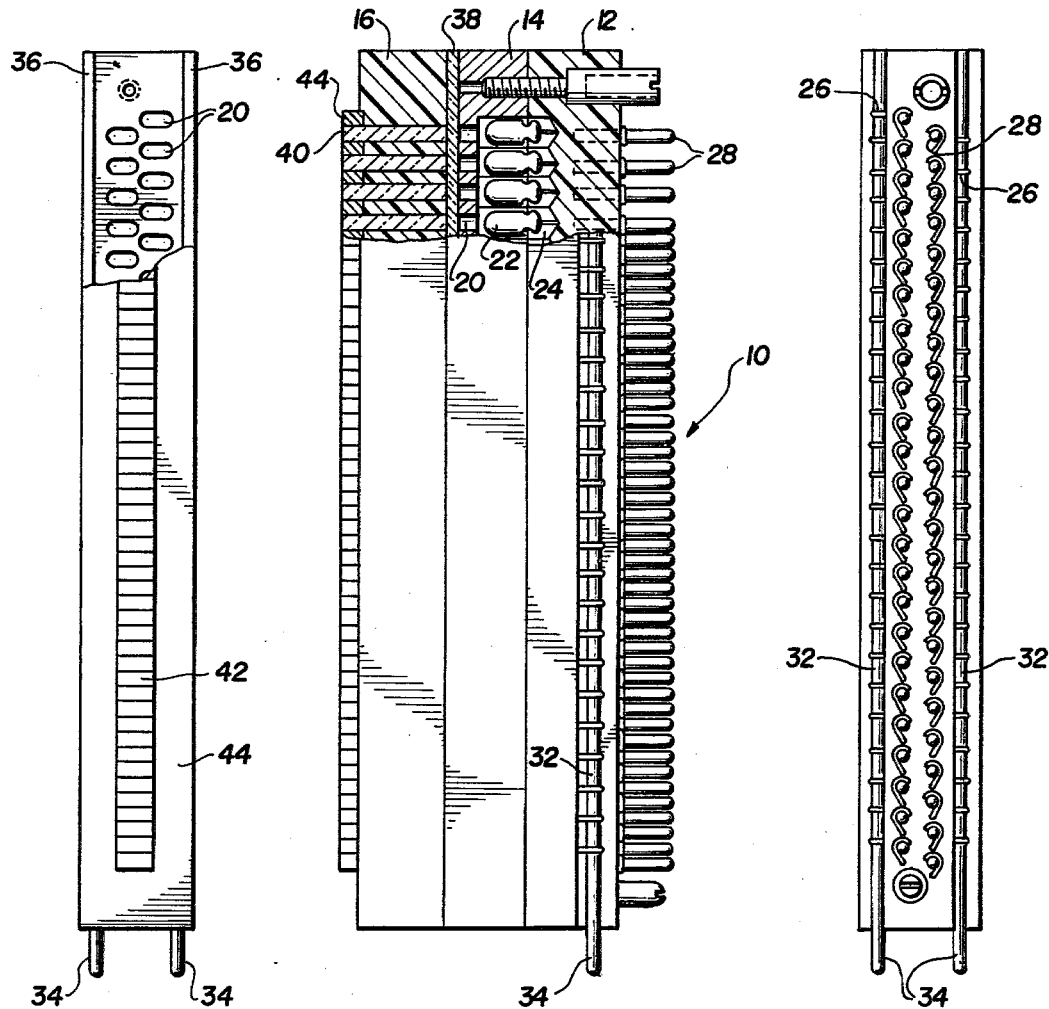

INCANDESCENT LAMPS/FIBER OPTIC COUPLED VERTICAL AND SCALE OR DISPLAY

BACKGROUND OF THE INVENTION

Prior Art display systems generally are mechanical and in the case of vertical scales consist of a electromechanically driven tape similar to motion picture projector with the scale viewed through a slot-type window. In the case of circular displays, pointers are used as a point source for a stationary tape. In either case, the display is driven by a motor and is subject to wear shock vibration and thus suffer from poor reliability and high maintenance involvement attendant with such mechanical drives.

The goal of this invention is to provide a solid state display which has the following features embodied therein;

1. Elimination of mechanical moving parts of the prior art displays which are subject to wear shock and vibration;
2. Decrease size and weight;
3. No readability inaccuracies caused by parallax since dial scale and display are in the same plane;
4. No cover glass or hermetic sealing required since there are no moving parts and the lamps themselves are hermetically sealed;
5. Readable under high ambient light conditions.

SUMMARY OF THE INVENTION

The display device which meets the foregoing goals comprises a matrix of discrete incandescent light bulbs which individually illuminate closely stacked light transmitting segments spaced along the length of a bar and supported on an electrically insulation member with the leads of the lamps passing to apertures and directly soldered to connector pins fixed within the insulation member. A metallic heat sink member containing a matrix of holes is provided in which are positioned the closely fitted lamps in two rows in staggered relationship, one hole for each of the individual lamps. Rectangular transparent plastic segments which serve as light pipes are stacked one on top of the other, alternately staggered in a V-formation, for the length of the bar so that the ends of the light pipes direct light from the lamps toward the center of the display and present emitted light in a well defined line. Inasmuch as each light pipe defines a dot position in a vertical or circular line it can be sequentially illuminated presenting a thermometer type display.

By means of a circuitry arrangement the following functions of this display can be obtained;

(a) Pointer Mode—the operation of selected light bulbs to display the reading point only, (b) Maximum and Minimum Range Warning Signals—by illuminating colored portions to denote out of range conditions or alternatively utilizing flashing lamps as a warning whenever a range is exceeded. By way of contrast, existing electromechanical tape displays can only depict fixed range marks in a dial scale and/or operate remote warning devices.

(c) Multi-Channel Instruments—alternate lamps in each display connected to an individual power supply supplying one-half of the lights, failure of this power supply would only blank out one-half of the lamps with the reduced resolution but without the total failure.

BRIEF DESCRIPTION OF THE DRAWINGS

FIG. 1 is a side view, in section, illustrating the display constructed in accordance with the teachings of this invention;

FIG. 2 is a side elevational view also partly in section, of the entire bar display;

FIG. 3 is a bottom view showing the connecting pins of the bar display of FIG. 2;

FIG. 4 is a top view of the bar display with a cover partially removed and;

DESCRIPTION OF THE PREFERRED EMBODIMENT

Figure 5:
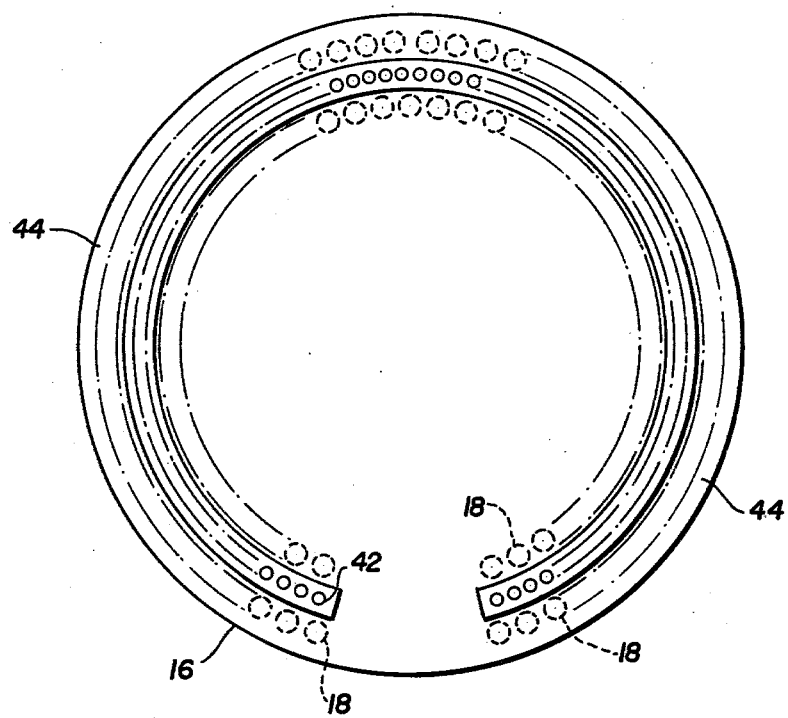
FIG. 5 is a view of the display according to this invention formed as a circular type display device.

Turning now to the drawings and particularly to the FIGS. 1 and 2, it can be seen that the bar display indicated in its entirety as 10 comprises an elongated insulating member 12 which extends the length of the entire bar display, an elongated heat sink member 14 which also extends the length of the bar display and an elongated module 16 formed of potting compound which also extends the length of the display.

Taking the insulating member 12 and the sink member 14 together, the heat sink member 14 is provided with a plurality of relatively larger apertures 18 in staggered relationship. The apertures 18 open into relatively small elongated apertures 20 more clearly shown in FIG. 4. In the apertures 18 are inserted a plurality of incandescent lamps 22 which also extend into blind holes 24 in the insulating member 12 so that the incandescent lamps 22 in fact lie in between the two members. Connector leads 26 for the incandescent bulbs extend through suitable openings in the insulating member and are connected to connector pins 28 which extend outwardly from the insulating member and are adapted to connect to a receptacle 30 shown in phantom in FIG. 1. One of the leads of each of the incandescent lamps is connected in common through elongated connector bar or rod 32 with similar lamps throughout the length of the display which terminate in connector pins 34 as more clearly shown in FIGS. 3 and 4 while the other leads are connected to the connector pins 28 which are inserted in the aforementioned receptacle 28.

The side of the heat sink member 14 opposite the insulating member is flanged as at 36 in which is seated a color filter 38 and is thus disposed in between the heat sink member and the potting compound to provide a suitable color to the transmitted light from the incandescent lamp. The module 16 formed of the potting compound is provided with plurality of light pipes or fiber optic members 40, one for each of the incandescent lamps. These light pipes are relatively thin, but generally rectangular in cross-section to optically coincide with apertures 20 and are stacked one on top of the other alternately, staggered in a V-formation, for the length of the display bar. The V-formation permits the light pipes to couple the light transmitted from the two rows of lamps 22 into a single line of dot positions of lights such as shown at 42 in FIG. 4 and for the purposes of forming a display the light pipes extend through a cover member 44 positioned over the module. This cover member may be suitably marked with indicia to form a reference scale is desired.

From the foregoing it can be seen that the module 16 containing the plastic segments directs light from each of the sources toward the center of the display to form a display bar and presents emitted light in a well defined line.

Turning now to FIG. 5 where the display is formed in a circular configuration for the purposes of this description elements having similar functions are given the same reference numeral. It can be seen that the formation of the alternate lamps in this embodiment permit a closely spaced stacked circular display. The cover member 44 in this embodiment also may be provided with indicia to form a reference scale, and also provided with a color filter (not shown) if desired.

It can be appreciated from the above description that whether the bar display or the circular display concept is utilized, since each of the lights are individually lighted the foregoing objects of the invention namely the pointer mode, the maximum and minimum range warning signals, or multi-channel instrumentation be be selected depending upon the wiring of the connector pins 28 and 34.

It should be pointed out so that since one of the rows of lamps 18 is connected in common with all the other lamps in that row and similarly the other row of lamps, the connector pins 28 which are connected to the receptacle 30 can be connected so as to take advantage of the inventive concept in the redundancy system utilizing a pair of power supplies as more clearly set forth in application for U.S. pat. Ser. No. 817,458 entitled REDUNDANCY SYSTEM FOR DISPLAYS by Z. REICH filed July 19, 1977 and assigned to the same assignee as this invention.

What is claimed is:

1. A display comprising;
   an elongated insulating member,
   an elongated heat sink member connected to said insulating member and having apertures in two parallel vertically extending rows therein with the apertures in each row in staggered relationship to one another;
   incandescent lamps in each of said apertures having conductor means extending into said insulating member and connected to connectors extending from said insulating member;
   an elongated module coextensive with said heat sink member and said insulating member;
   said module having a plurality of plastic light pipes stacked on one another alternately in V-formation one end of each terminating alternatingly at a respective aperture in said two vertically extending rows in said heat sink member at said incandescent lamp and the other terminating in vertically extending lines forming a vertical array of dot positions to form a dot type array.

2. The display as claimed in claim 1 wherein a color filter is interposed between said light pipes and said incandescent lights for coloring the transmitted light.

3. The display as claimed in claim 2 where one of said connectors from said incandescent lamps is connected in common with all of other said connectors in said row while the other connectors are connected to a suitable source of power.

4. The display as claimed in claim 2 wherein said other ends of said light pipes are arranged in a straight line.

5. The display as claimed in claim 2 wherein said other ends of said light pipes are arranged in a circle.

* * * * *